United States Patent [19]

Freund et al.

[11] Patent Number: 4,884,031
[45] Date of Patent: Nov. 28, 1989

[54] METHOD AND APPARATUS FOR CHARGE DISTRIBUTION ANALYSIS

[76] Inventors: Friedemann Freund, 225 Sussex St., San Francisco, Calif. 94131; Francois Batllo, 1970 Latham St., #25, Mountain View, Calif. 94040

[21] Appl. No.: 250,951

[22] Filed: Sep. 29, 1988

[51] Int. Cl.$^4$ .............................................. G01R 5/28
[52] U.S. Cl. .................... 324/459; 324/457; 324/464; 177/210 EM
[58] Field of Search ................ 324/72, 456, 457, 376, 324/98, 109, 452, 459; 73/862.68; 177/210 EM, 210 C, 210 R

[56] References Cited

U.S. PATENT DOCUMENTS

| | | | |
|---|---|---|---|
| 2,661,456 | 12/1953 | Bosch | 324/109 |
| 2,734,735 | 2/1956 | Payne | 177/212 |
| 3,106,978 | 10/1963 | Cahn | 177/212 |
| 3,234,462 | 2/1966 | Holdsworth | 324/109 |
| 3,443,224 | 5/1969 | Kramer | 324/72.5 |
| 3,652,932 | 3/1972 | Sessler | 324/72 |
| 4,370,616 | 1/1983 | Williams | |
| 4,553,089 | 11/1985 | Lewiner | 324/457 |

FOREIGN PATENT DOCUMENTS

| | | | |
|---|---|---|---|
| 0649183 | 2/1979 | U.S.S.R. | 324/109 |
| 0900221 | 1/1982 | U.S.S.R. | 324/109 |
| 0995016 | 2/1983 | U.S.S.R. | 324/452 |
| 1046714 | 10/1983 | U.S.S.R. | 324/457 |
| 1247781 | 7/1986 | U.S.S.R. | 324/457 |

OTHER PUBLICATIONS

Lehovec, (1953), J. Chem. Phys. 21(7): 1123–1128.
Kliewer et al., (1965), Phys. Rev. 140(4A): 1226–1246.
Kingery, (1974), J. Am. Ceram. Soc. 57(2): 74–83.
Perkin-Elmer Corporation, "Instructions for TGS-1 Thermobalance", 1967, pp. 1-1 through 8-1.
King et al., (1984) Physical Review B 29(10): 5814–5824.
Freund, (185), J. of Non-Crystalline Solids 71: 195–202.
"Product Description: Lewis Coil Force Magnetometer", and George Associates Series 300 Lewis Coil Force Magnetometers in Perf. Specs. (1 Apr. 1988), pp. 1–11.

*Primary Examiner*—Reinhard J. Eisenzopf
*Assistant Examiner*—Jose M. Solis
*Attorney, Agent, or Firm*—Irell & Manella

[57] ABSTRACT

Method and apparatus of charge distribution analysis insulating and semiconducting dielectric materials to measure by means of a Coulomb Balance surafce/subsurface space charge layers and the sign, mobility and polarizability of charge carriers. The technique includes measuring the force, attractive or repellent, between a bias electrode to which a voltage is applied and a dielectric material in a condensor half cell arrangement. An apparatus is provided for heating a sample for causing the generation of surface/subsurface charges, and then for applying an external potential while the sample is maintained at a high temperature. The effective mass of the sample is detected by determining the amount of force necessary to restore a balance arm, by which the sample is supported, to its original position, the alteration in position being due to attractive or repulsive electrostatic forces between the sample and the electrodes. The effective mass reflects the amount of peroxies or impurities within the sample, and the method and apparatus may be used for scientific mineral composition analysis, quality control of the purity of semiconductors, and in other applications. The heating of the sample may be a combination of any of conductive, convective and radiative means.

30 Claims, 10 Drawing Sheets

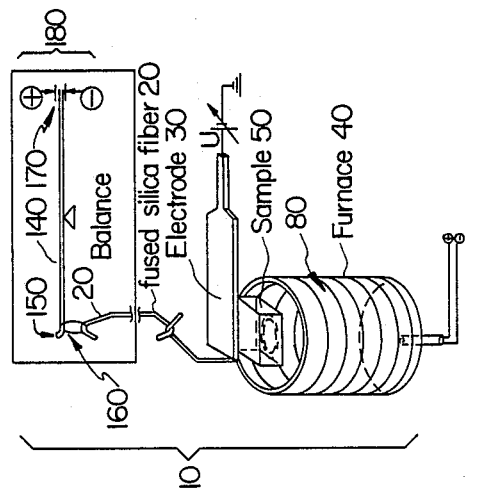
FIG. 1
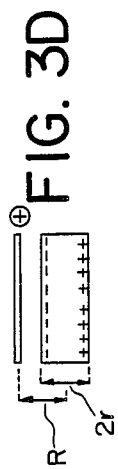
FIG. 3C
FIG. 3D
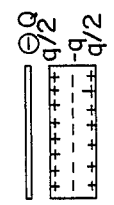
FIG. 3A
FIG. 3B

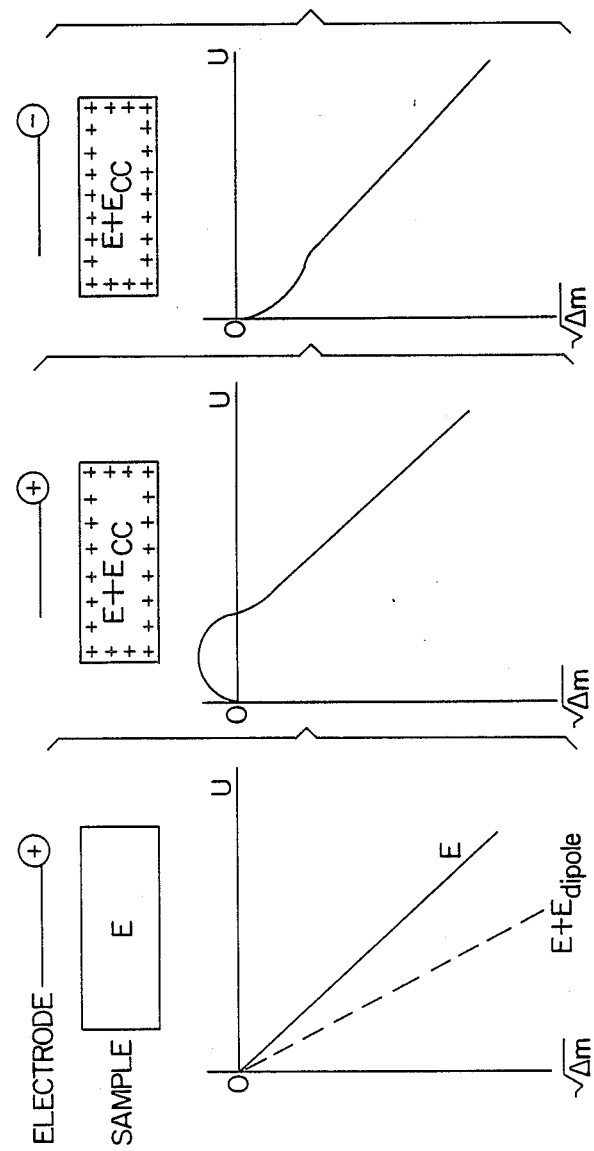

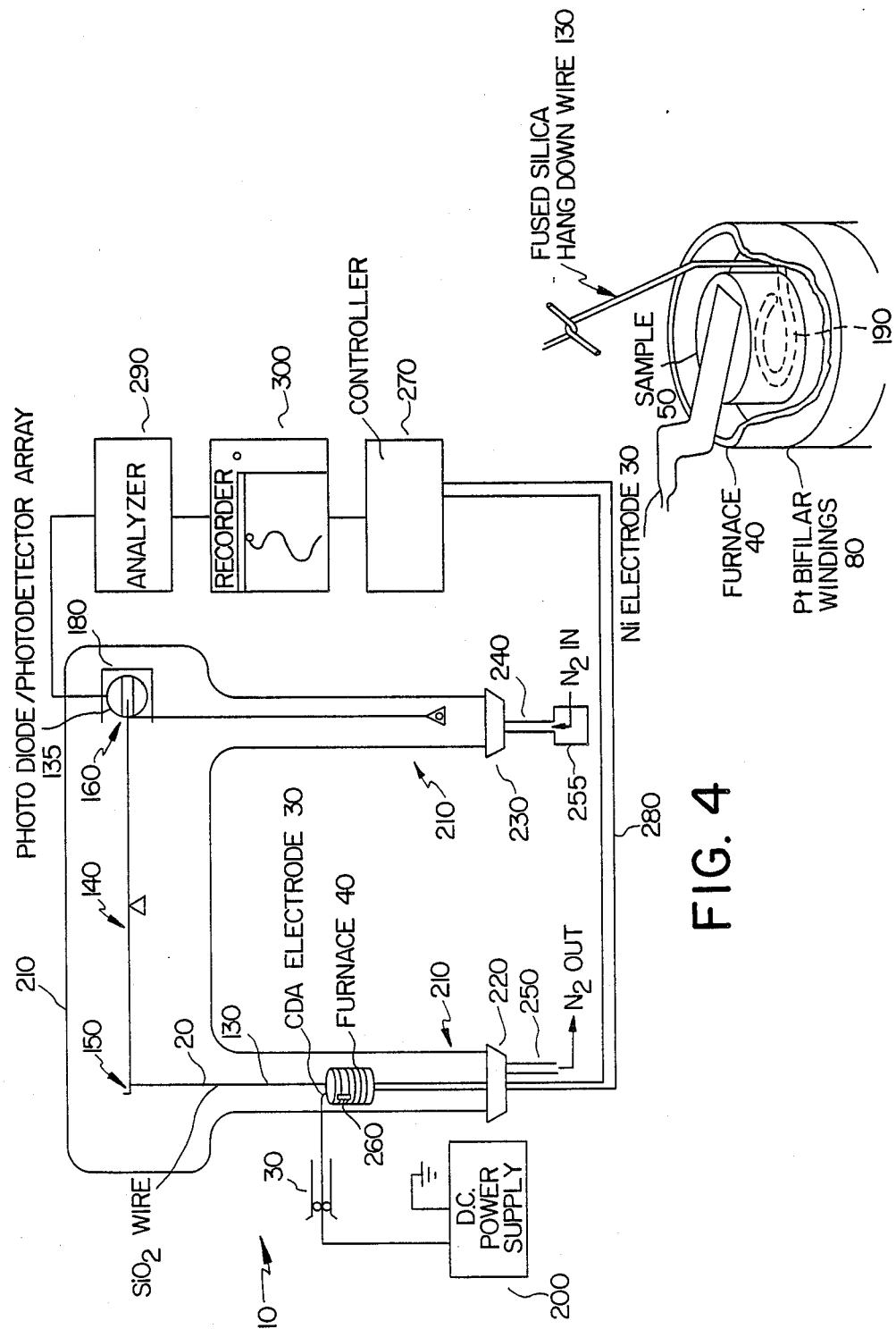

METHOD AND APPARATUS FOR CHARGE DISTRIBUTION ANALYSIS

BACKGROUND OF THE INVENTION

The present invention is directed to a new apparatus and method of charge distribution analysis, or CDA, to measure surface and/or subsurface charge layers, the sign of dominant charge carriers, and their mobility in--as well as the dielectric constant of--insulating and semiconducting dielectric materials.

The existence of surface/subsurface charge layers has been theoretically predicted on the basis of fundamental thermodynamic laws, specifically for ionic insulators. For instance, discussions of such charge layers may be found in the following articles: K. Lehovec, J. Chem. Phys. 21, 1123 (1953); K. L. Kliewer and J. S. Koehler, Phys. Rev. 140A, 1226 (1965); and W. D. Kingery, J. Am. Ceram. Soc. 57, 1 (1974) and 57, 74 (1974). A discussion of oxide insulators with electronic defects is found in the article by B. V. King and F. Freund, Phys. Rev. B29, 5814 (1984). The presence of such charge layers has been concluded from a variety of indirect observations such as the preferred segregation of certain aliovalent cations to surfaces and/or grain boundaries (Kingery 1974 articles cited above), the deflection of low energy electron or ion beams from surfaces, the energy dispersion of photoelectrons emitted from surfaces and many manifestations of electrostatic adhesion. Each of the above references is hereby incorporated herein by reference.

However, no method has existed until now for directly measuring and quantifying surface/subsurface charge layers, and for determining the sign and mobility of the dominant charge carriers.

Prior methods such as the measurement of cation surface or gain boundary segregation in ceramics are indirect and limited to high temperatures. They require thermal pretreatment of the samples, extensive sample preparation for observation of frozen-in disequilibrium states by microanalytical techniques (Kingery 1974) or extremely clean surface conditions in ultrahigh vacuum. Prior methods such as the deflection or energy dispersion of low energy charged beams, both electrons and other particles, inherently require high or ultrahigh vacua, and are restricted to very thin surface/subsurface layers due to the limited depth of penetration or escape depth of low energy electron or ion beams.

Prior methods such as based on electrostatic adhesion are qualitative at best, giving no or very limited information about the strength of the effect, about the concentration and the nature of the dominant charge carriers.

SUMMARY OF THE INVENTION

It is an object of this invention to provide a method for charge distribution analysis, or CDA, for measuring surface/subsurface charge layers, and for determining the sign of the dominant charge carriers and their mobility in insulating and semiconducting dielectric materials.

It is a further object of this invention to utilize as a force sensor an electronic force-sensitive device or a balance, appropriately called a Coulomb Balance, to measure the force between a dielectric material carrying a surface/subsurface charge layer and a bias electrode at close proximity to which a voltage may be applied.

It is still another object of this invention to measure this force as a function of various physical parameters including, but not limited to, the sign of the applied voltage, the magnitude of the applied voltage, sample position, sample temperature, photon flux, phonon (sound wave) flux, electron bombardment and particle bombardment.

It is yet another object of this invention to measure the said force in a static mode.

It is yet another object of this invention to measure the said force in a dynamic mode.

It is an additional object of this invention to utilize for the measurement of said force a horizontal beam balance with top-loading or direct loading on the beam.

It is a further object of this invention to utilize for the measurement of said force a horizontal beam balance with bottom-loading via a hang-down wire.

It is also an object of this invention to utilize for the measurement of said force a torsion balance.

It is an additional object of this invention to utilize for the measurement of said force an electronic force-sensitive device including but not limited to position-sensitive or pressure-sensitive or tensionsensitive devices.

BRIEF DESCRIPTION OF THE DRAWINGS

FIG. 1 shows a charge distribution analysis apparatus according to the present invention.

FIGS. 2A, 2C and 2B show responses to applied electric fields of, respectively, an ideal dielectric material and a dielectric material with charge carriers of a certain mobility.

FIGS. 3A-3D show force measurements due to charge mobility for four limiting cases of charge distribution.

FIG. 4 shows an apparatus according to the present invention.

FIG. 4A shows an enlarged view, partially cut away, of a portion of an apparatus according to the invention.

DETAILED DESCRIPTION OF THE INVENTION

Figure 5:
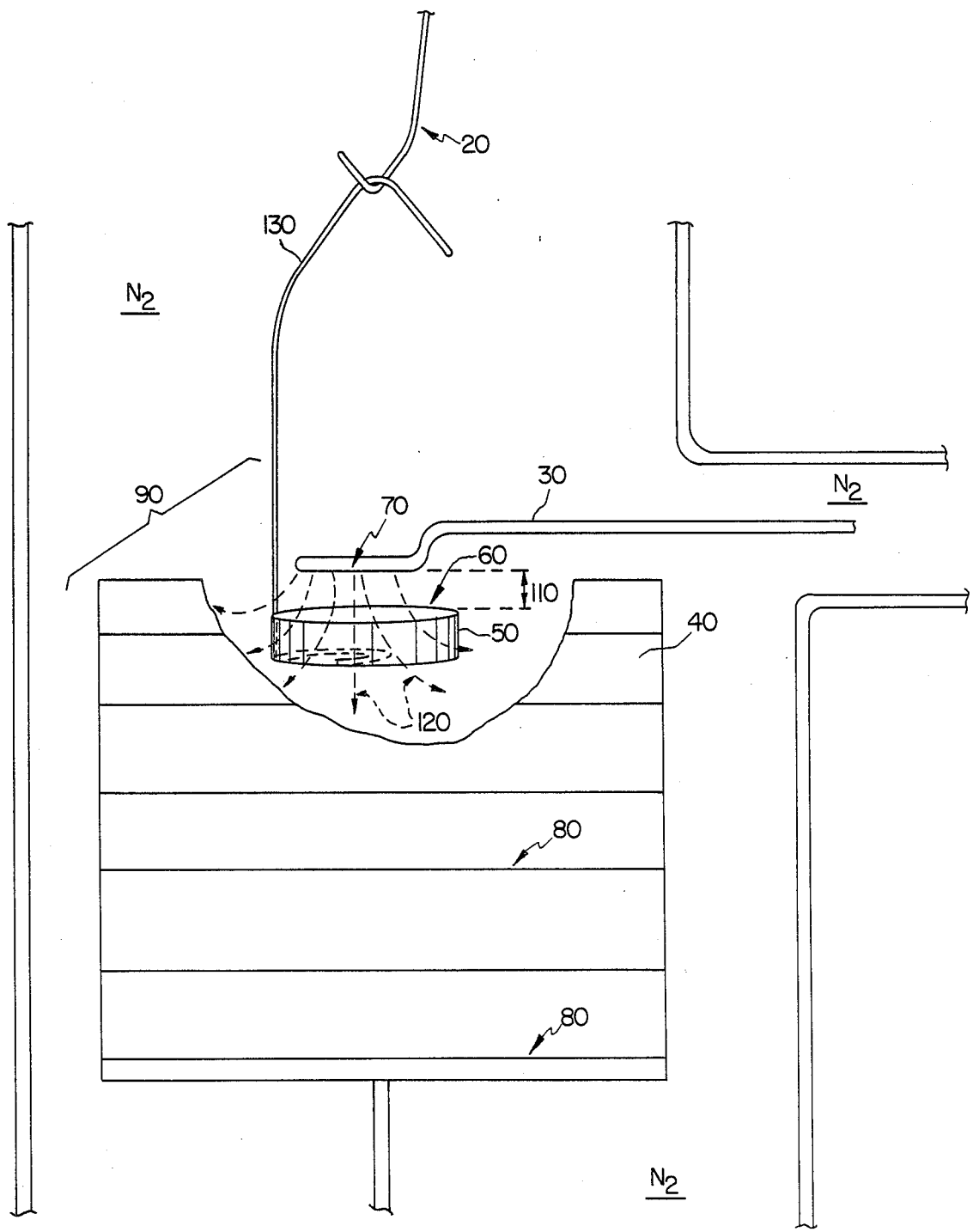
FIG. 5 shows an enlarged view of a portion of a device according to the present invention.

Turning now to the drawings, more particularly to FIG. 1, there is shown, in accordance with the invention, an example of a Coulomb Balance for charge distribution analysis using a conventional bottom-loading balance 10, such as the TGS Thermobalance produced by Perkin-Elmer, which is marked with U.S. Pat. No. 3,140,097, which is incorporated herein by reference. In the present invention, a hang-down wire 20 is utilized in conjunction with the balance 10, and a bias electrode 30 is also used, to which a positive or negative voltage can be applied. A grounded furnace 40 is used to vary the temperature of the sample 50. The sample 50 preferably has a flat, polished surface 60, and is suspended in such a manner as to be fully insulated from gound. The wire 20 may be of silicon dioxide ($SiO_2$). In the preferred embodiment, the electrode 30 is of nickel.

FIG. 2A shows the force measured between electrode and sample under CDA conditions for an ideal dielectric insulator (solid line) and for an ideal dielectric insulator with dipoles (dashed line). FIG. 2B shows the force over an insulator with positive surface charge under positive bias and FIG. 2C shows the same under negative bias.

As shown in FIG. 5, the electrode 30 preferably has a flat portion 70 which is substantially parallel to the flat surface 60 and is positioned a predetermined distance above the sample 50.

The electrode/sample arrangement to be used in CDA and exemplified in the insert in FIG. 1 is that of a capacitor half cell where the sample is placed in an nonhomogeneous electric field. The bias electrode 30 forms on electrode of a capacitor, and is carried by an insulated support 100. As shown schematically in FIGS. 1 and 4, the electrode 30 is connected to an electrical biasing circuit.

The furnace 40 is preferably formed from ceramic, and has windings 80 embedded therein, with the windings 80 defining the counterelectrode for the capacitor 90. Thus, the sample 50, being positioned between the electrode 30 and the windings 80, acts as a dielectric for the capacitor 90. The windings 80 are typically of platinum.

Other forms of electrodes than shown as the example in FIGS. 1 and 5 may be used in accordance with the invention, including but not limited to wedge-shaped or needle-shaped electrodes or 1-dimensional or 2-dimensional electrode arrays, and other types of force-measuring devices. Also other force measuring devices than the balance shown as an example in FIG. 1 may be used in accordance with the invention allowing to arrange the bias electrode differently, to substitute the furnace by or to combine it with a cooling jacket, or to replace it by a radiation-heating device and to add access ports or openings for additional instrumentation.

Both the sample 50 and the electrode-bearing device, while being at ground potential or any chosen positive or negative potential, be electrically as highly insulated as possible.

The gap or distance 110 (shown in FIG. 5) between the sample 50 and the bias electrode 30 to which a positive or negative potential may be applied, is preferably smaller than the distance to any equipotential surface by which a counterelectrode may be defined. In addition, the gap 110 should be smaller than, or of the same order of magnitude as, the thickness of the sample measured in the direction of the electric field lines, such as field lines 120 shown in FIG. 5. In the configuration of FIG. 5, this means that the gap should be less than approximately the thickness of the sample 50 measured in the vertical direction from the point of view of that Figure.

The following discussion is of a theory which applicants believe explain the operation of the present invention. Following the theoretical discussion is the discussion of the actual operation of the invention and its method of use.

Theory

Evaluating the Maxwell equations one can deduce the force F acting on a dielectric in an electric external field $E_0$:

$$F = -\int_v (P \cdot grad) E_0 dV \qquad (1)$$

where P is the polarization of the dielectric $E_0$ is the external applied field in the absence of the dielectric. The integral is to be taken over some volume fully enclosing the dielectric body, but without the sources of the field. If the medium is an ideal dielectric, the relation $$P = \frac{\epsilon - 1}{4\pi} E_0$$

holds. Inserting this into equation (1) and using the fact that $\nabla \Delta E_0 = 0$ we find:

$$F = -\frac{\epsilon - 1}{4\pi} \int_v E_0 \nabla \cdot E_0 \, dV \qquad (2)$$

Since the electric field $E_0$ is proportional to the potential difference U of the electrodes, $F^{U2}$ or $U \sim \sqrt{1F1}$, the slope of U verus $\sqrt{F}$ is proportional to $\sqrt{E-1}$.

From equation (2) we also see that F vanishes in a constant electric field. To exert a force on the dielectric an nonhomogeneous electric field is therefore essential. At the same time a change in the polarity of $E_0$ should leave F invariant, which is not observed experimentally. It may also be noted that the strikingly different behavior the $\sqrt{F}$ vs. V curve under positive and negative bias cannot be due to temperature gradients, since when evaluating the force F one finds a term $F_T \sim E_0^2$ grad T. Since this term is quadratic in $E_0$, it is invariant under changes of the polarity of $E_0$.

In order to explain the behavior of the dielectric in an nonhomogeneous electric field we must assume additional second order terms in P which may be of the form:

$$P = P_0 - \frac{\epsilon - 1}{4\pi} E_0 \qquad (3)$$

In principle both the applied external field $E_0$ and P can be calculated:

The applied external electric field is given by $E_0 = -grad \, \phi_0$, where $\phi_0$ is the scalar potential. $\phi_0$ depends only the geometry of the conductors and must be a solution of the Laplace equation $\Delta \phi_0 = 0$ using appropriate boundary conditions. In order to calculate P we first note that the electric induction D is defined by $D = E + 4\pi P$. P satisfies Maxwell's equation div $P = -p$, where p is the induced volume charge. The total charge in the body vanishes, $\int p dV = 0$, but note that $\int prdV = \int PdV$ is the total dipole moment of the dielectric body. After making a microscopic model of P, the dielectric constant and the scalar potential $\phi$ must satisfy a set of two equations:

(a) $\{\phi = 0$ and
(b) grad $\Sigma$grad $\phi = 0$, where we have used that $E = -$grad $\phi$ and divD=div $\Sigma E = $-div $(\Sigma grad\phi) = 0$. If the dielectric body is homogeneous, grad $\Sigma = 0$ which reduces the problem to solving $\Delta \phi = 0$. As long as the geometry of the electrode-sample arrangement is not well defined we have to postpone the numerical calculation.

Of particular interest to CDA are the cases where the charges consist of dissociated charge carriers of finite mobility and a spatial distribution within the sample which is initially non-uniform, due to either frozen-in disequilibrium states or to the existence of thermodynamically controlled surface/subsurface space charge layers.

In FIGS. 2A-2C there are shown schematically three cases of interest used here to illustrate the response of a dielectric material to an nonhomogeneous electric field expressed as square root of the force $1F1^{\frac{1}{2}}$ versus the applied bias voltage U. FIG. 2A represents an example of an ideal dielectric in which an nonhomogeneous electric field generates a straight line passing through the origin with a slope proportional to $(e-1)^{\frac{1}{2}}$. FIG. 2B represents a dielectric with a dielectric constant $e=1$ with q charge carriers of mobility u[mu], and with a positive surface charge with a positive bias voltage generating at first a repulsion between sample and electrode, followed by an attraction which leads to a straight line not passing through the origin. FIG. 2C represents the analogous case for a negative bias voltage and the corresponding response of the sample characterized by an enhancement of the attractive force not passing through the origin. The simplified geometry depicted in FIGS. 2A–2C is for the sake of illustration only and may be modified according to the other possible sample/electrode arrangements cited in this patent disclosure.

Operation

Measurement of the attractive and repulsive force due to the presence of charge carriers and possible non-uniform distribution of charge carriers under negative and/or positive bias allows the derivation of information about the nature of the charges in the sample, about their sign, concentration, spatial distribution, mobility and relaxation times. Likewise, information can be derived about the dielectric constant, its dependence on the various parameters, and about dipole or higher pole relaxation processes, through such information may also be obtained by conventional impedance measurements in symmetrical condensor arrangements, e.g., without the special features of the CDA half cell arrangement which is described in this patent disclousre.

Referring now to FIGS. 4, 4A and 5, the apparatus shown therein is utilized in the following manner. A sample, such as a sample of olivine, obsidian, silica, or some other material, is configured and polished to have a flat surface, such as sample 50 with surface 60. The sample is placed upon a support 190, which may be simply a coil of the wire 130. The wire 130 is preferably of fused silica.

A D.C. power supply 200 is electrically connected to the windings 80, and is used to energize the windings so as to heat the furnace 40 and thereby heat the sample 50.

As noted above, the balance 10 is a conventional bottom-loading balance; however, it is modified in accordance with the present invention, such as by the addition of circuitry and electrodes to form the capacitor 90. Reference to the balance 10 herein shall be to the balance as so modified.

As shown in FIGS. 1, 4 and 5, the sample 50 is attached to a wire 130 or other support mechanism, which is in turn supported by the hang-down wire 20. The balance 10 includes a balance arm 140, from a first end 150 of which the wire 20 is attached, either directly as shown in FIG. 4 or by means of another attachment device such as a loop 160, as shown in FIG. 1.

The balance arm 140 has a second end 170. When the mass of a sample such as sample 50 is altered, the balance 10 detects a variation in the position of the end 170, such as by means of a photodiode array 135, in a standard manner. Other conventional position or motion detection means may be utilized, such as electrical or capacitive means. The balance 10 includes a means 180 for restoring the second end 170 to its original position when the mass of a sample (such as sample 50) is altered.

In the present invention, the actual mass of the sample 50 is not altered, but the apparent mass (i.e., the mass detected by the balance 10) is altered, due to the attractive force established between the sample 50 and the electrode 30 upon heating of the sample 50 and establishment of an electric field across the capacitor 90.

The furnace 40, the sample 50, the arm 140, the photodetector array 135, and the electrode 30 are preferably at least partially enclosed in a chamber 210 with seals 220 and 230 and means 240 and 250 for injecting and releasing nitrogen, respectively. The injecting means may include a source 255 of pressurized nitrogen, or may be a pump or some other means for providing a nitrogen environment. The nitrogen ($N_2$) is utilized to prevent the sample from oxidizing, combusting, or otherwise undergoing changes which may be undesirable. It will be appreciated that other environments may be utilized that fulfill this function, such as helium or other inert gases. Alternatively, oxygen, hydrogen, carbon monoxide, carbon dioxide, or other oxidizing or reducing gases may be utilized, depending upon the desired application, since these gases may result in better detection of peroxies.

A conventional thermostatic control 260 is provided at the furnace 50, and is coupled to a controller 270 via controller connector 280. At the controller 270, the operator of the apparatus may choose the desired temperature range, and set the thermostatic control 260 to maintain a particular temperature. Typically, a sample will be tested at a variety of temperatures in a given run.

Once the sample 50 has been heated to the desired, predetermined temperature, a voltage is supplied by means of the power supply 200 to the electrode 30. The windings 80, which as indicated above act as a counterelectrode, are grounded, so that the total potential across the capacitor 90 is due to the power supply 200.

Applicants have learned that the surface charges on many types of minerals alter with both temperature and applied potential, and that this is an indication of the amount of peroxies, or impurities, within the sample. In the area of insulators or semiconductors, this provides an important method of detecting defects in the crystalline structure, such as in silica or silicon, since the defects may cause migration to the surface or subsurface of the sample of charge carriers. Thus, a measurement of the effect of applied temperature and external potential upon the sample 50 provides a measurement of the amount of impurities within the sample. Such effects are detected by measuring the apparent mass of the sample 50 by means of the balance 10.

As the sample 50 heats up, if peroxies or other impurities are present, they will migrate to the surface of the sample. This may result in either an initial positive charge at the surface (such as in the case of peroxies), or an initial negative charge. If the applied external voltage is positive and the surface/subsurface charge in the sample is also positive, there will be an electrostatic repulsion between the electrode 30 and the sample 50. However, as the potential is continually applied by the electrode 30, eventually there is a reorientation of the dipoles within the sample 50, with the result that there is an ultimately attractive force between the electrode 30 and the sample 50.

Both the attraction and the repulsion are reflected by the balance 10, because each results in an alteration in the position of the end 160 of the arm 140. The photodetector array 135 detects the change in position of the end 160, and the restoring means 180 restores the arm 140 to its initial position. The amount of force (or, alternatively, work) necessary to perform this restoring function is determined in a conventional fashion by an analyzer 290 which is coupled to both the array 135 and the restoring means 180, for reading the responses of the array 135 and for controlling the means 180. The analyzer has an output which is a correlation of the applied voltage with the restorative forces necessary to rebalance the arm 140, and thus the analyzer output reflects the amount of subsurface charges present in the sample 50.

The analyzer output is recorded by a conventional means for recording 300, which may be include a graph generator, an electronic memory, and other means of storing and displaying information.

Figure 7:
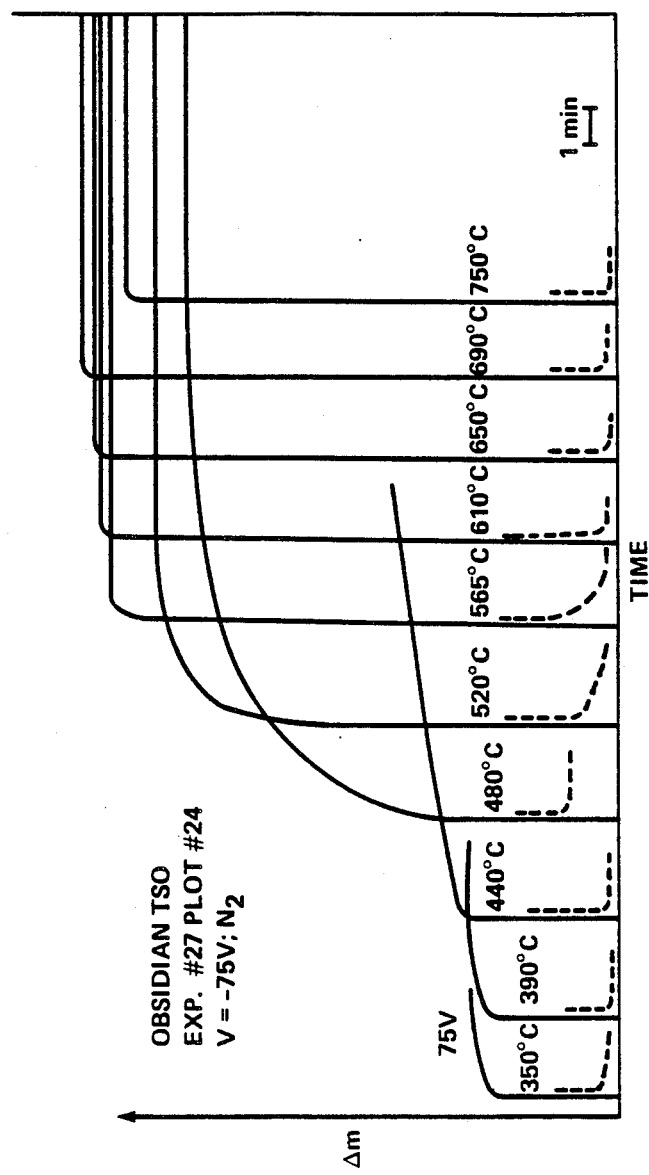
FIGS. 7-13 show various test results utilizing the method and apparatus of the present invention.

Typical results of the recorder 300 are as shown in FIGS. 2A–2C, discussed above. Additional results are shown in FIGS. 7–13, all of which relate to actual tests utilizing the method and apparatus of the present invention on obsidian. FIG. 7 represents the effective mass detected by the balance when obsidian has been heated to the various temperatures shown, and then an external voltage of 75 volts is applied. As indicated by that figure, at first when the voltage is applied, there is an initial attraction of the sample to the bias electrode (indicated by the rise in the effective mass, or delta-m), and then over time (note the 1-minute scale on the right), the attraction increases. This indicates attraction due to peroxies in the sample, and thus provides a measure of the amount of these peroxies. Note that as the temperature increases, the effect of the peroxies on the effective mass also increases.

Figure 8:
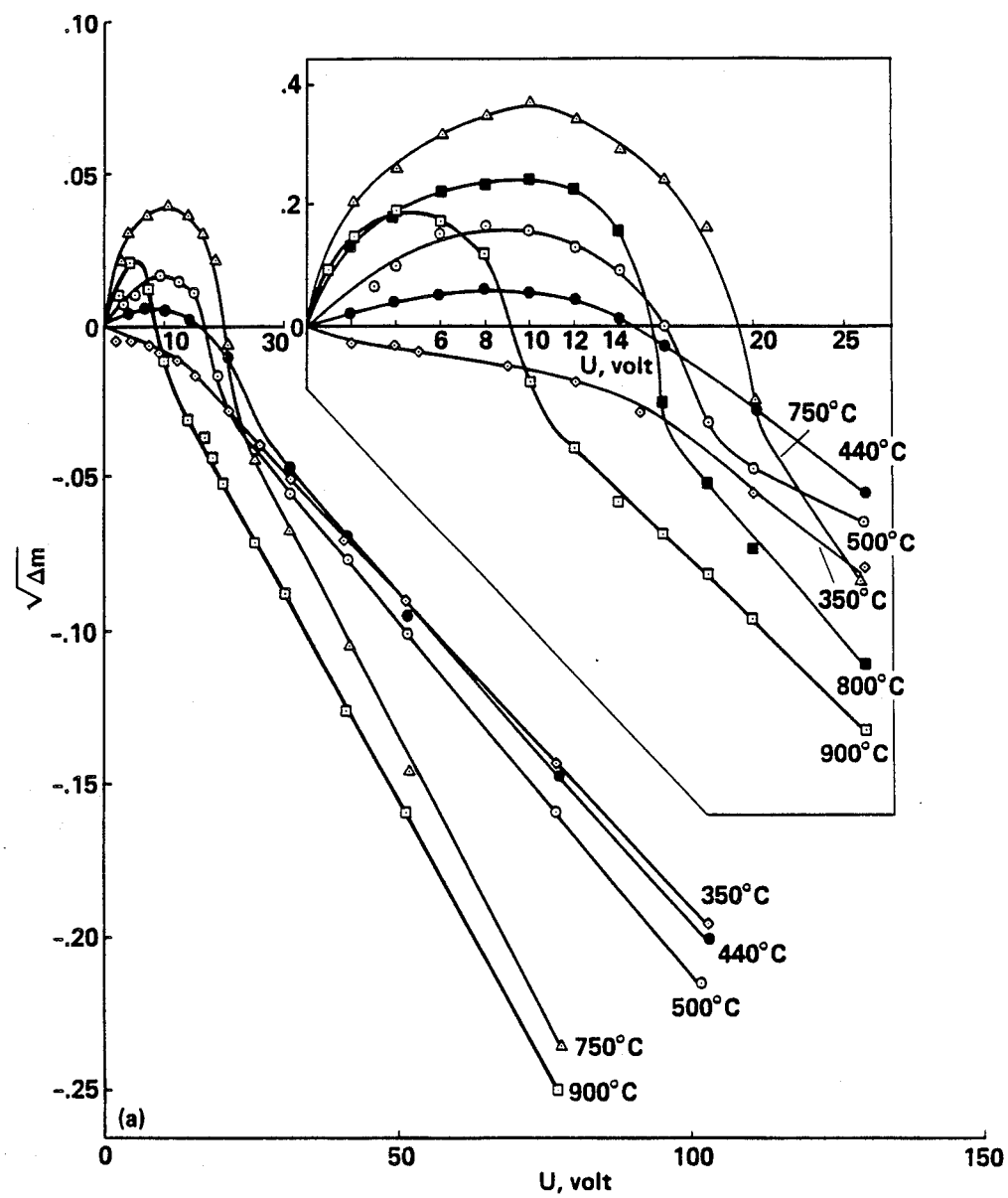

FIG. 8 shows the effect on a sample wherein there is initially a repulsion, which is due to the presence of positive subsurface charges. Past a certain applied voltage for each given temperature, the oriented dipoles cause electrostatic attraction with the bias electrode, and thus there is eventually a net attraction despite the presence of the peroxies causing a positive subsurface charge. The amount of the initial repulsive effect is a measure of the amount of peroxies. In the case of quality control for silica or other semiconductor products, this would be a measure of the amount of impurities within the product.

Figure 9:
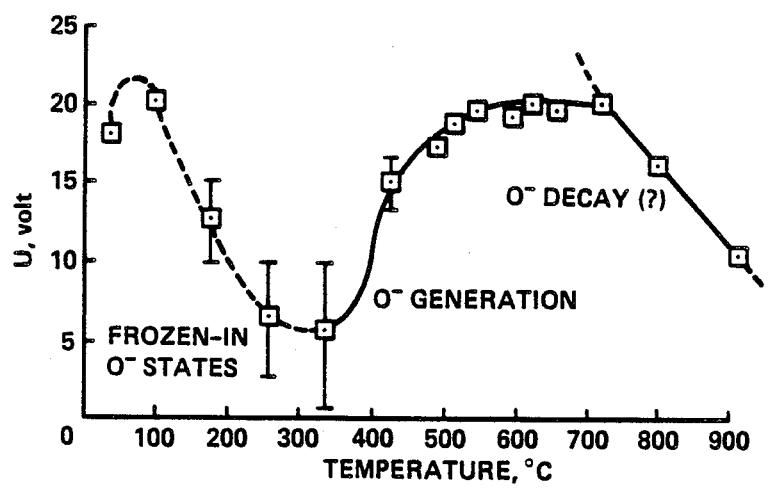

FIG. 9 shows, in the dotted-line graph, the response of a sample which has been treated by heating it up to a high temperature, such as between 300' and 7003° C., and then rapidly cooling it, thereby "freezing in" the subsurface charges due to the peroxies. The solid-line portion of FIG. 9 shows the response of a sample where the subsurface charges have not been frozen in.

Figure 10:
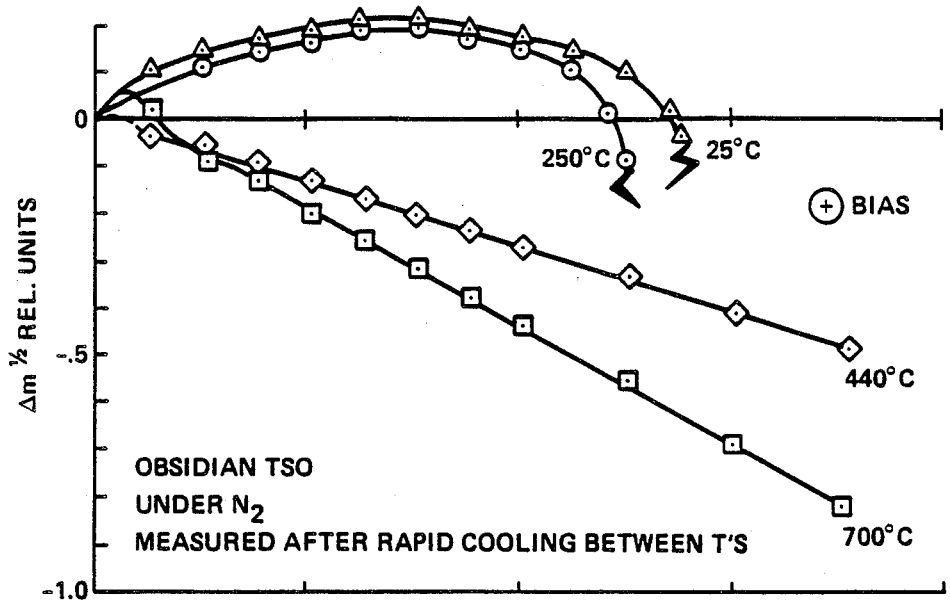
Figure 11:
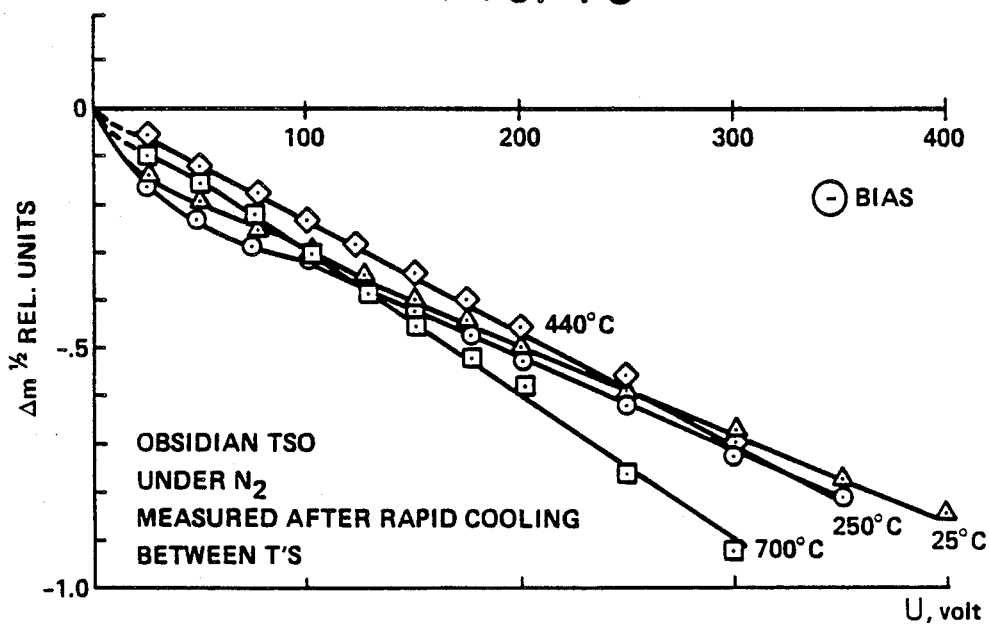

FIGS. 10 and 11 show the results of the method and apparatus of the invention wherein positive and negative external biasing potentials, respectively, are applied to a sample of obsidian wherein the subsurface charges have been frozen in, as described above.

Figure 12:
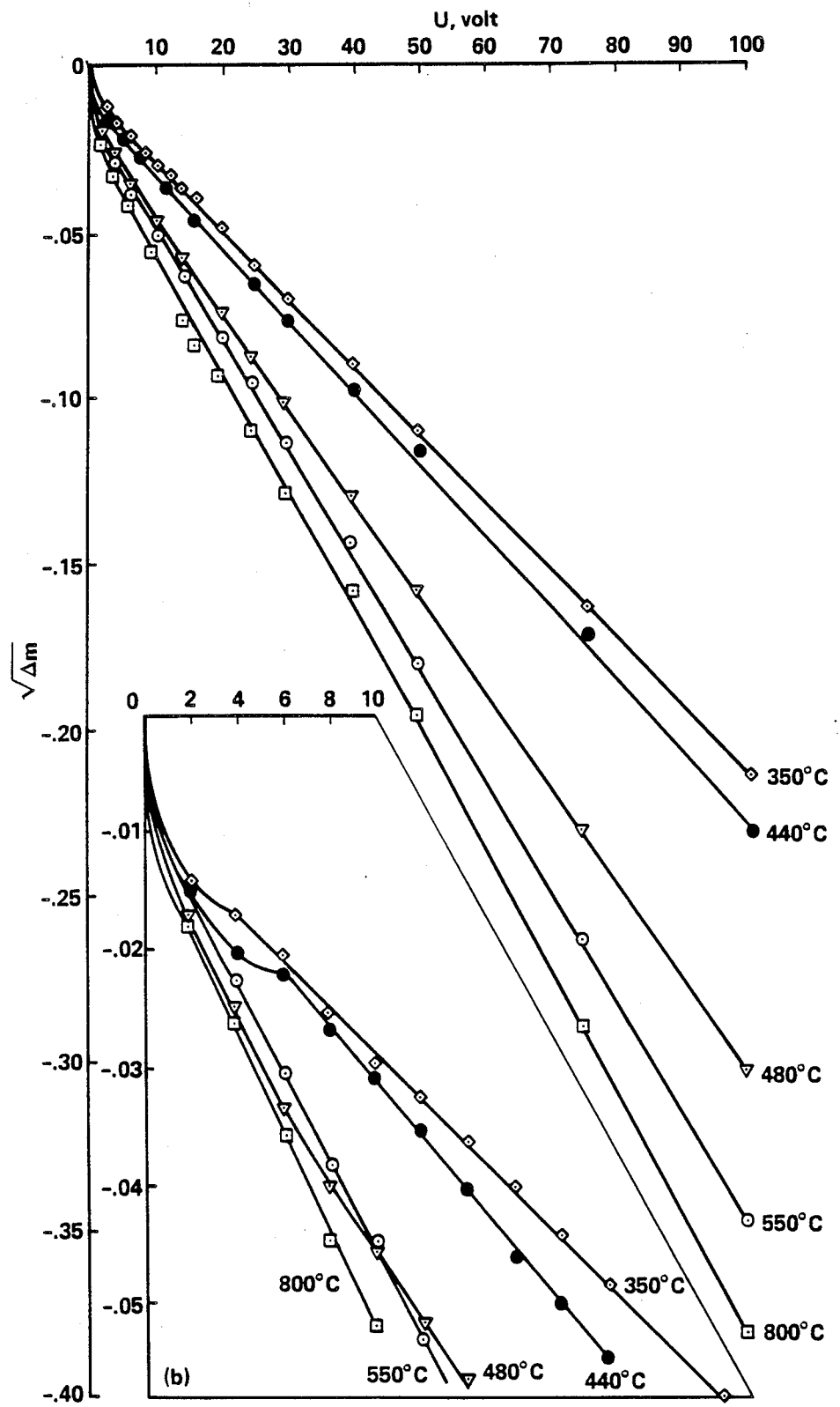

FIG. 12 shows a set of test results for obsidian at various applied voltages and again indicates the attraction due to the peroxies. The inset of FIG. 12 is an enlarged section near the origin of the graph. The results shown in FIG. 12 are analogous to those of FIG. 8, except that they reflect the use of a negative, instead of positive, applied potential.

Figure 13:
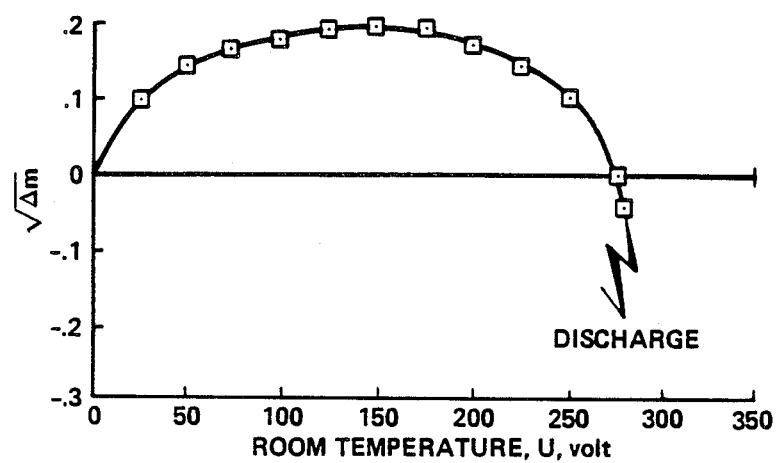

FIG. 13 shows the results of a test at room temperature for a sample of obsidian wherein the peroxy subsurface charges have been frozen in as described above. As indicated, past a certain voltage (here, about 275 V. applied external potential), there is a discharge between the sample and the windings of the furnace, i.e. the counterelectrode.

Figure 6:
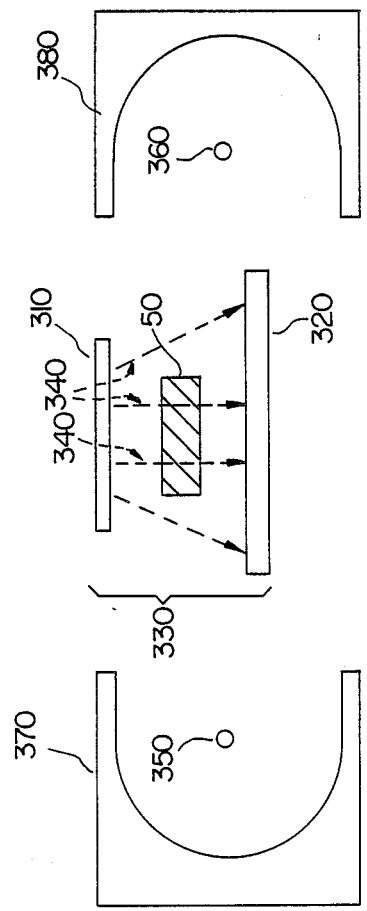
FIG. 6 shows a portion of an alternative embodiment of the present invention.

An alternative embodiment of the apparatus of the invention is shown in FIG. 6. In this embodiment, the sample 50 is heated by infrared radiation, rather than by convection and/or conduction heating, as with the first embodiment. A combination of these methods of heating the sample may also be utilized. In the embodiment of FIG. 6, a bias electrode 310 and a counterelectrode 320 are used, and the sample 50 is positioned therebetween, as with the embodiments of FIGS. 1, 4 and 5. However, in this embodiment, the counter electrode 320 does not serve as a heater, and thus the configuration may be one of many different shapes, allowing for great latitude in determining the geometric configuration of the resulting capacitor 330. In FIG. 6, the counterelectrode 320 is chosen to be larger than the electrode 310, to ensure that the resulting electric field 340 is nonhomogeneous.

Infrared generators 350 and 360 are provided, and heat the sample 50 by radiative heating. Infrared reflectors 370 and 380 are provided, positioned near the generators 350 and 360, to maximize the effectiveness of the infrared generators.

The following variations may be made on the method and apparatus of the invention. The electrodes and the sample may be configured such that a significant portion of the electric field lines emanating from the bias electrode traverse the sample, and such that the average distance between the surface of the sample opposing the bias electrode and the grounded equipotential surface, called the counter gap, is larger than the gap between the bias electrode and the sample. The gap and the counter gap may be of various relative sizes.

In another embodiment, the bias electrode, instead of being of planar shape, may instead be of a generally nonplanar shape including but not limited to a wedge-like or needle-like shape or a 1-dimensional or 2-dimensional array of needle-like electrodes, each electrically insulated from all other electrodes with the provision to apply a bias voltage to each of them individually.

It is advantageous to minimize the linkage force between the bias electrode and the means for applying a potential thereto.

In one embodiment, the electrodes and the sample may be vertically oriented adjacent one another. In this and the other embodiments, grid may be inserted in the gap to be operated as a control electrode.

In another embodiment, a mechanical device is included which allows, when operated, to mechanically touch the sample in order to ground it or to charge it to a preselected positive or negative potential.

In another embodiment, radioactive source is included which allows, when brought into proximity of the sample, the electrical discharge of the sample by ionization.

In another embodiment, a cooling device is included which allows, when operated, to control the temperature of the sample to temperatures below ambient. The cooling device may be used in place of or in conjunction with the furnace.

In another embodiment, device may be added to expose the sample to electromagnetic radiation or electron or other particle bombardment.

The apparatus as discussed above is preferably contained in a gas-tight or vacuum-tight container.

In an alternative embodiment, secondary electrode may be added to the bias electrode to monitor the rise and fall of the bias. The bias potential may be increased or decreased or reversed in a step-wise time function, or in an oscillatory fashion.

It will be understood that the embodiments described herein are merely illustrative, as there are many variations and modifications which may be made by those skilled in the art. Thus, the invention is to be construed as being limited only by the spirit and scope of the claims.

We claim:

1. An apparatus for measurement of electrostatic forces, comprising:
   a mass balance including an arm, means attached to said arm for supporting a mass, and means coupled to said arm for determining an amount of force required to maintain said arm at a predetermiend position upon placement of said mass upon said supporting means;
   means for heating said mass to a predetermined temperature;
   a first electrode and a second electrode positioned near said mass for forming a capacitor with said mass as a dielectric;
   means for applying a potential across said first and second electrodes;
   means for displaying any attraction and repulsion between either of said first and second electrodes and said mass upon application of said potential.

2. The apparatus of claim 1, wherein said first electrode, said second electrode, and said mass are configured such that an electric field generated resulting from said potential is nonhomogeneous.

3. The apparatus of claim 1, wherein said mass is electrically insulated from said electrodes and from said balance.

4. The apparatus of claim 1, further including a grid positioned between said sample and one of said first and second electrodes, said grid for serving as a control electrode.

5. The apparatus of claim 1, further comprising a radioactive source positioned near said mass for electrically discharging said sample by ionization.

6. The apparatus of claim 1, further including means for cooling said sample for maintaining said mass at temperatures below ambient temperature.

7. The apparatus of claim 1, wherein said mass is maintained in an environment of inert material.

8. The apparatus of claim 7, wherein said inert material is nitrogen.

9. An apparatus for measurement of electrostatic forces, comprising:
   a mass balance including an arm, means attached to said arm for supporting a mass, and means coupled to said arm for determining an amount of force required to maintain said arm at a predetermined position upon placement of said mass upon said supporting means;
   means for inducing charge carriers within said mass;
   a first electrode and a second electrode positioned near said mass for forming a capacitor with said mass as a dielectric;
   means for applying a potential across said first and second electrodes;
   means for displaying any attraction and repulsion between either of said first and second electrodes and said mass upon application of said potential.

10. The apparatus of claim 9, wherein said inducing means comprises means for heating said mass.

11. The apparatus of claim 9, wherein said inducing means comprises means for imparting photon flux.

12. The apparatus of claim 9, wherein said inducing means comprises means for imparting phonon flux.

13. The apparatus of claim 9, wherein said inducing means comprises means for bombarding said mass with particles.

14. The apparatus of claim 13, wherein said particles are electrons.

15. (New) A method for determining presence of charge carriers in a material, including the steps of:
    (1) placing a sample of the material on a force-measuring device;
    (2) generating a first nonhomogeneous electric field in a volume including the sample;
    (3) measuring a first force on the sample due to the first electric field;
    (4) generating a second nonhomogeneous electric field in the volume including the sample;
    (5) measuring a second force on the sample due to the second electric field;
    (6) evaluating for a variance between the first force and the second force; and
    (7) determining from the variance whether charge carriers are present within the material.

16. The method of claim 15, further including, after step 7, the step of determining an amount of charge carriers for the sample.

17. The method of claim 15, including, after step 2, and before step 3, the step of inducing charge carriers within the material.

18. The method of claim 17, wherein the inducing step includes heating the sample of the material.

19. The method of claim 17, wherein said inducing step includes the step of imparting photon flux.

20. The method of claim 17, wherein said inducing step includes the step of imparting phonon flux.

21. The method of claim 17, wherein said inducing step includes the step of bombarding said mass with particles.

22. The method of claim 21, wherein said particles are electrons.

23. The method of claim 15, where the material is silica.

24. The method of claim 15, where the material is olivine.

25. The method of claim 15, where the material is obsidian.

26. The method of claim 15, wherein the volume is an evacuated volume.

27. The method of claim 15, wherein the volume includes an inert gas.

28. The method of claim 15, wherein the volume includes a reactive gas.

29. The method of claim 28, wherein the reactive gas is an oxidizing gas.

30. The method of claim 28, wherein the reactive gas is a reducing gas.

* * * * *